United States Patent
Cuadra et al.

(10) Patent No.: US 10,630,285 B1
(45) Date of Patent: Apr. 21, 2020

(54) SWITCHING CIRCUITS HAVING DRAIN CONNECTED FERRITE BEADS

(71) Applicant: Transphorm Inc., Goleta, CA (US)

(72) Inventors: Jason Cuadra, San Jose, CA (US); Yifeng Wu, Goleta, CA (US); Zhan Wang, Goleta, CA (US)

(73) Assignee: Transphorm Technology, Inc., Goleta, CA (US)

( * ) Notice: Subject to any disclaimer, the term of this patent is extended or adjusted under 35 U.S.C. 154(b) by 0 days.

(21) Appl. No.: 16/195,578

(22) Filed: Nov. 19, 2018

Related U.S. Application Data

(60) Provisional application No. 62/589,509, filed on Nov. 21, 2017.

(51) Int. Cl.
| | |
|---|---|
| *H03K 17/16* | (2006.01) |
| *H03K 17/687* | (2006.01) |
| *H03K 17/041* | (2006.01) |
| *H03K 17/10* | (2006.01) |
| *H03K 17/12* | (2006.01) |

(52) U.S. Cl.
CPC ..... *H03K 17/162* (2013.01); *H03K 17/04106* (2013.01); *H03K 17/102* (2013.01); *H03K 17/122* (2013.01); *H03K 17/6871* (2013.01); *H03K 17/6874* (2013.01); *H03K 2217/0063* (2013.01); *H03K 2217/0072* (2013.01)

(58) Field of Classification Search
CPC ................. H03K 17/04; H03K 17/041; H03K 17/04106; H03K 17/102; H03K 17/122; H03K 17/16–162; H03K 17/687; H03K 17/6871; H03K 17/6874; H03K 2217/0063; H03K 2217/0072
See application file for complete search history.

(56) References Cited

U.S. PATENT DOCUMENTS

| | | | | | |
|---|---|---|---|---|---|
| 5,587,650 | A | * | 12/1996 | Massie | ..... G05F 1/575 323/282 |
| 5,623,198 | A | * | 4/1997 | Massie | ..... G05F 1/575 323/282 |
| 6,278,470 | B1 | * | 8/2001 | Pollutro | ..... B41J 2/385 347/120 |

(Continued)

OTHER PUBLICATIONS

Barr et al., "High Voltage GaN Switch Reliability," WIPDA Conference, Atlanta, GA, Nov. 2018, 7 pages.

(Continued)

*Primary Examiner* — Patrick O Neill
(74) *Attorney, Agent, or Firm* — Fish & Richardson P.C.

(57) ABSTRACT

A circuit includes an electronic component package that comprises a first lead, a second lead, and a third lead; and a III-N transistor encased in the electronic component package, the III-N transistor including a drain, a gate, and a source, where the source is coupled to the first lead, the gate is coupled to the second lead, and the drain is coupled to the third lead. The circuit includes a high voltage node and a resistor, the resistor having a first terminal coupled to the high voltage node and a second terminal coupled to the third lead. The circuit further includes a ferrite bead connected in parallel to the resistor and coupled between the third lead and the high voltage node. When switching, the deleterious effects of a parasitic inductance of the circuit's power loop are mitigated by the ferrite bead and the resistor.

24 Claims, 11 Drawing Sheets

(56) References Cited

U.S. PATENT DOCUMENTS

| | | |
|---|---|---|
| 7,795,642 B2 | 9/2010 | Suh et al. |
| 7,851,825 B2 | 12/2010 | Suh et al. |
| 7,875,907 B2 | 1/2011 | Honea et al. |
| 7,884,394 B2 | 2/2011 | Wu et al. |
| 7,898,004 B2 | 3/2011 | Wu et al. |
| 7,915,643 B2 | 3/2011 | Suh et al. |
| 7,939,391 B2 | 5/2011 | Suh et al. |
| 7,965,126 B2 | 6/2011 | Honea et al. |
| 8,138,529 B2 | 3/2012 | Wu |
| 8,193,562 B2 | 6/2012 | Suh et al. |
| 8,237,198 B2 | 8/2012 | Wu et al. |
| 8,289,065 B2 | 10/2012 | Honea et al. |
| 8,344,424 B2 | 1/2013 | Suh et al. |
| 8,389,977 B2 | 3/2013 | Chu et al. |
| 8,390,000 B2 | 3/2013 | Chu et al. |
| 8,431,965 B2 | 4/2013 | Takemae |
| 8,455,931 B2 | 6/2013 | Wu |
| 8,493,129 B2 | 7/2013 | Honea et al. |
| 8,508,281 B2 | 8/2013 | Honea et al. |
| 8,519,438 B2 | 8/2013 | Mishra et al. |
| 8,530,996 B2 | 9/2013 | Shono |
| 8,531,232 B2 | 9/2013 | Honea et al. |
| 8,536,622 B2 | 9/2013 | Takemae et al. |
| 8,541,815 B2 | 9/2013 | Takemae et al. |
| 8,541,818 B2 | 9/2013 | Wu et al. |
| 8,569,124 B2 | 10/2013 | Akiyama et al. |
| 8,581,300 B2 | 11/2013 | Yamada |
| 8,592,974 B2 | 11/2013 | Wu |
| 8,598,937 B2 | 12/2013 | Lal et al. |
| 8,603,880 B2 | 12/2013 | Yamada |
| 8,624,662 B2 | 1/2014 | Parikh et al. |
| 8,633,517 B2 | 1/2014 | Kamada |
| 8,633,518 B2 | 1/2014 | Suh et al. |
| 8,643,062 B2 | 2/2014 | Parikh et al. |
| 8,648,643 B2 | 2/2014 | Wu |
| 8,664,927 B2 | 3/2014 | Shono |
| 8,675,326 B2 | 3/2014 | Shono |
| 8,692,294 B2 | 4/2014 | Chu et al. |
| 8,716,141 B2 | 5/2014 | Dora et al. |
| 8,742,459 B2 | 6/2014 | Mishra et al. |
| 8,742,460 B2 | 6/2014 | Mishra et al. |
| 8,766,711 B2 | 7/2014 | Takemae |
| 8,772,842 B2 | 7/2014 | Dora |
| 8,773,176 B2 | 7/2014 | Miyazaki et al. |
| 8,786,327 B2 | 7/2014 | Honea et al. |
| 8,803,246 B2 | 8/2014 | Wu et al. |
| 8,816,497 B2 | 8/2014 | Wu |
| 8,816,751 B2 | 8/2014 | Honea et al. |
| 8,836,301 B2 | 9/2014 | Shono |
| 8,836,308 B2 | 9/2014 | Shono |
| 8,836,380 B2 | 9/2014 | Takemae |
| 8,841,702 B2 | 9/2014 | Mishra et al. |
| 8,847,283 B2 | 9/2014 | Kamada et al. |
| 8,860,495 B2 | 10/2014 | Lal et al. |
| 8,878,248 B2 | 11/2014 | Ishiguro et al. |
| 8,878,571 B2 | 11/2014 | Takemae |
| 8,883,581 B2 | 11/2014 | Ohki |
| 8,890,206 B2 | 11/2014 | Yamada |
| 8,890,314 B2 | 11/2014 | Wu |
| 8,895,421 B2 | 11/2014 | Parikh et al. |
| 8,895,423 B2 | 11/2014 | Dora |
| 8,901,604 B2 | 12/2014 | Mishra et al. |
| 8,912,839 B2 | 12/2014 | Honea et al. |
| 8,933,489 B2 | 1/2015 | Kikkawa |
| 8,952,750 B2 | 2/2015 | Wu |
| 8,957,453 B2 | 2/2015 | Yamada et al. |
| 8,962,409 B2 | 2/2015 | Tomabechi |
| 9,006,787 B2 | 4/2015 | Yamada |
| 9,035,356 B2 | 5/2015 | Yamada |
| 9,041,435 B2 | 5/2015 | Honea et al. |
| 9,041,465 B2 | 5/2015 | Bouisse |
| 9,059,076 B2 | 6/2015 | Wu et al. |
| 9,059,136 B2 | 6/2015 | Kamada et al. |
| 9,087,718 B2 | 7/2015 | Lal |
| 9,093,366 B2 | 7/2015 | Mishra et al. |
| 9,099,351 B2 | 8/2015 | Nishimori et al. |
| 9,099,545 B2 | 8/2015 | Akiyama et al. |
| 9,111,961 B2 | 8/2015 | Chu et al. |
| 9,136,107 B2 | 9/2015 | Katani et al. |
| 9,142,638 B2 | 9/2015 | Yamada |
| 9,142,658 B2 | 9/2015 | Kikkawa et al. |
| 9,147,760 B2 | 9/2015 | Mishra et al. |
| 9,165,766 B2 | 10/2015 | Keller et al. |
| 9,171,730 B2 | 10/2015 | Chowdhury et al. |
| 9,171,836 B2 | 10/2015 | Lal et al. |
| 9,171,910 B2 | 10/2015 | Wu et al. |
| 9,184,275 B2 | 11/2015 | Mishra et al. |
| 9,190,295 B2 | 11/2015 | Wu |
| 9,196,716 B2 | 11/2015 | Mishra et al. |
| 9,209,176 B2 | 12/2015 | Wu et al. |
| 9,224,671 B2 | 12/2015 | Parikh et al. |
| 9,224,721 B2 | 12/2015 | Wu |
| 9,224,805 B2 | 12/2015 | Mishra et al. |
| 9,231,075 B2 | 1/2016 | Yamada |
| 9,244,848 B2 | 1/2016 | Boyd et al. |
| 9,245,992 B2 | 1/2016 | Keller et al. |
| 9,245,993 B2 | 1/2016 | Keller et al. |
| 9,257,547 B2 | 2/2016 | Fichtenbaum et al. |
| 9,293,458 B2 | 3/2016 | Parikh et al. |
| 9,293,561 B2 | 3/2016 | Mishra et al. |
| 9,299,822 B2 | 3/2016 | Kikkawa |
| 9,318,593 B2 | 4/2016 | Wu et al. |
| 9,343,560 B2 | 5/2016 | Suh et al. |
| 9,349,805 B2 | 5/2016 | Ito et al. |
| 9,362,903 B2 | 6/2016 | Wu et al. |
| 9,373,699 B2 | 6/2016 | Chu et al. |
| 9,401,341 B2 | 7/2016 | Wu |
| 9,425,268 B2 | 8/2016 | Minoura et al. |
| 9,437,707 B2 | 9/2016 | Mishra et al. |
| 9,437,708 B2 | 9/2016 | Mishra et al. |
| 9,443,849 B2 | 9/2016 | Wu et al. |
| 9,443,938 B2 | 9/2016 | Mishra et al. |
| 9,490,324 B2 | 11/2016 | Mishra et al. |
| 9,496,137 B2 | 11/2016 | Chu et al. |
| 9,520,491 B2 | 12/2016 | Chowdhury et al. |
| 9,536,966 B2 | 1/2017 | Ogino |
| 9,536,967 B2 | 1/2017 | Kikkawa et al. |
| 9,537,425 B2 | 1/2017 | Honea |
| 9,543,940 B2 | 1/2017 | Wang et al. |
| 9,590,060 B2 | 3/2017 | Lal |
| 9,590,494 B1 | 3/2017 | Zhou et al. |
| 9,620,616 B2 | 4/2017 | Yamada et al. |
| 9,634,100 B2 | 4/2017 | Mishra et al. |
| 9,640,648 B2 | 5/2017 | Kikkawa |
| 9,660,640 B2 | 5/2017 | Wang et al. |
| 9,685,323 B2 | 6/2017 | Keller et al. |
| 9,685,338 B2 | 6/2017 | Minoura et al. |
| 9,690,314 B2 | 6/2017 | Honea et al. |
| 9,741,702 B2 | 8/2017 | Wu |
| 9,818,686 B2 | 11/2017 | Wu et al. |
| 9,818,840 B2 | 11/2017 | Kikkawa |
| 9,831,315 B2 | 11/2017 | Chu et al. |
| 9,842,922 B2 | 12/2017 | Mishra et al. |
| 9,865,719 B2 | 1/2018 | Keller et al. |
| 9,899,998 B2 | 2/2018 | Honea et al. |
| 9,935,190 B2 | 4/2018 | Wu et al. |
| 9,941,399 B2 | 4/2018 | Mishra et al. |
| 9,991,884 B2 | 6/2018 | Wang et al. |
| 10,043,896 B2 | 8/2018 | Mishra et al. |
| 10,043,898 B2 | 8/2018 | Lal |
| 10,063,138 B1 | 8/2018 | Zhou et al. |
| 2006/0139017 A1* | 6/2006 | Peiffer ............... G01R 31/2889 323/282 |
| 2016/0006428 A1* | 1/2016 | Wang ................... H03K 17/16 327/109 |

OTHER PUBLICATIONS

Coffie, "Characterizing and Suppressing DC-to-RF Dispersion in AlGaN/GaN High Electron Mobility Transistors," 2003, PhD Thesis, University of California, Santa Barbara, 169 pages.

Coffie et al., "Unpassivated p—GaN/AlGaN/GaN HEMTs with 7.1 W/mm at 10 GhZ," Electronic Letters, 2003, 39(19):1419-1420.

(56) References Cited

OTHER PUBLICATIONS

Chu et al., "1200-V Normally Off GaN-on-Si Field-effect Transistors with Low Dynamic On-Resistance," IEEE Electron Device Letters, 2011, 32(5):632-634.

Dora et al., "High Breakdown Voltage Achieved on AlGaN/GaN HEMTs with Integrated Slant Field Plates," IEEE Electron Device Letters, 2006, 27(9):713-715.

Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, Mar. 2006, 157 pages.

Huang and Cuadra, "Preventing GaN Device VHF Oscillation," APEC 2017 Industry Session, Mar. 2017, 25 pages.

Keller et al., "GaN—GaN Junctions with Ultrathin AlN Interlayers: Expanding Heterojunction Design," Applied Physics Letters, 2002, 80(23):4387-4389.

Mishra et al., "AlGaN/GaN HEMTs—An Overview of Device Operation and Applications," Proceedings of the IEEE, 2002, 90(6):1022-1031.

Parikh et al., "Commercialization of High 600V GaN-on-Silicon Power HEMTs and Diodes," 2013 IEEE, 5 pages.

Parikh, "Driving the Adoption of High-voltage Gallium Nitride Filed-effect Transistors," IEEE Power Electronics Magazine, Sep. 2017, 3 pages.

Parikh et al., "650 Volt GaN Commercialization Reaches Automotive Standards," ECS Transactions, 2017, 80(7):17-28.

Shen, "Advanced Polarization-based Design of AlGaN/GaN HEMTs," Jun. 2004, PhD Thesis, University of California, Santa Barbara, 192 pages.

Smith and Barr, "Reliability Lifecycle of GaN Power Devices," Transphorm Inc., Mar. 2017, 8 pages.

Suh et al. "High-Breakdown Enhancement-mode AlGaN/GaN HEMTs with Integrated Slant Field-Plate," Electron Devices Meeting, 2006, IEDM '06 International, 3 pages.

Wang et al., "Investigation of Driver Circuits for GaN HEMTs in Leaded Packages," Workshop on Wide Bandgap Power Devices and Applications (WiPDA), 2014 IEEE, pp. 81-87.

Wang, et al., "Design and Implementation of a High-efficiency Three-level Inverter Using GaN HEMTs," PCIM Europe 2015, May 19-21, 2015, Nuremberg, Germany, 7 pages.

Wang et al., "Paralleling GaN HEMTs for Diode-free Bridge Power Converters," 2015 IEEE Applied Power Electronics Conference and Exposition (APEC), Charlotte, NC, 2015, pp. 752-758.

Wu, "AlGaN/GaN Microwave Power High-Mobility Transistors," PhD Thesis, University of California, Santa Barbara, Jul. 1997, 134 pages.

Wu, "Paralleling High-speed GaN Power HEMTs for Quadrupled Power Output," Applied Power Electronics Conference and Exposition (APEC), 2013, pp. 211-214.

Wu et al., "A 97.8% Efficient GaN HEMT Boost Converter with 300-W Output Power at 1 MHz," Electronic Device Letters, 2008, IEEE, 29(8):824-826.

Wu et al., "High-frequency, GaN Diode-free Motor Drive Inverter with Pure Sine Wave Output," PCIM Europe 2012, Conference Digest, pp. 40-43.

Wu et al., "Total GaN Solution to Electrical Power Conversion," the 69th IEEE Device Research Conference, Conference Digest, Jun. 20-22, 2011, pp. 217-218.

Wu et al., "Advances in Reliability and Operation Space of High-voltage GaN Power Devices on Si Substrates," (2014) IEEE, 3 pages.

Wu et al., "k-V-Class GaN-on-Si HEMTs Enabling 99% Efficiency Converter at 800 V and 100 kHz," IEEE Transactions on Power Electronics. 2014 29(6):2634-2637.

Xu et al., "Investigation of 600 V GaN HEMTs for High Efficiency and High Temperature Applications," Applied Power Electronics Conference and Exposition (APEC), Apr. 2014, pp. 131-136.

Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.

Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.

Zhang, "High Voltage GaN HEMTs with Low On-resistance for Switching Applications," PhD Thesis, University of California, Santa Barbara, Sep. 2002, 166 pages.

Zhang et al., "Gate Drive Design Considerations for High Voltage Cascode GaN HEMT," Applied Power Electronics Conference and Exposition (APEC), Mar. 2014, pp. 1484-1489.

Zhang et al., "Impact of Interleaving on AC Passive Components of Paralleled Three-phase Voltage-source Converters," IEEE Transactions on Industry Applications, May/Jun. 2010, 46(3): 1042-1054.

Zhou et al., "High-efficiency True Bridgeless Totem Pole PFC Based on GaN HEMTs: Design Challenges and Cost-effective Solution," PCIM Europe 2015, pp. 1482-1489.

Zhou and Wu, "99% Efficiency True-bridgeless Totem-pole PFC Based on GaN HEMTs," PCIM Europe May 14-16, 2013, pp. 1017-1022.

Zuk and Campeau, "How to Design with GaN in 1 Hour!," APEC 2017 Exhibitor Session, Mar. 2017, 24 pages.

\* cited by examiner

SWITCHING CIRCUITS HAVING DRAIN CONNECTED FERRITE BEADS

CROSS-REFERENCE TO RELATED APPLICATION

This application claims priority to U.S. Provisional Application No. 62/589,509, filed on Nov. 21, 2017. The disclosure of the prior application is considered part of and is incorporated by reference in the disclosure of this application.

TECHNICAL FIELD

This specification relates to stabilizing switching circuits, e.g., high speed III-N power switches, using ferrite beads.

BACKGROUND

Wide band gap III-N FETs provide significant advantages over silicon super junction MOSFETs, offering lower gate charge, faster switching speeds, and smaller reverse recover charge. High speed III-N switches can exhibit in-circuit switching speeds in excess of 200V/ns, compared to current silicon technology at less than 50V/ns, with an accompanying high di/dt during switching. Using high-speed III-N power switches involves balancing requirements for heat transfer, ease of assembly, and high-speed, low-inductance electrical interconnection. Conventional leaded power packages, such as any of the variations of the TO-220 package, can be used with III-N power switches. The combination of a metal mounting tab and flexible copper leads permits attachment of the package to effective heat sinks in a variety of configurations. Connection to a PCB with conventional soldering techniques permits ease of manufacture.

Nonetheless, the package leads typically introduce undesirable inductance. Reduction in switching speed caused by this inductance may be an acceptable design compromise, but instability may still present a problem. Since a power switch can be a high-gain device, if allowed to operate in a linear mode, care should be taken that any oscillations due to parasitic resonances do not couple to a node where positive feedback may sustain or amplify the oscillations.

FIG. 1 is a circuit diagram of a half bridge circuit comprising a gate driver 102, a high side III-N transistor 104 coupled to a high voltage node 106, and a low side III-N transistor 108 coupled to a ground node 110. Two terminals of the gate driver 102 are coupled to respective gates of the transistors 104 and 108, and two terminals of the gate driver are coupled to respective sources of the transistors 104 and 108, such that the gate driver is able to apply voltage signals to the gates of each of transistors 104 and 108 relative to their respective sources. An inductive load 114 is coupled to the half bridge circuit at a load node 112.

In operation, the gate driver 102 can operate the transistors 104 and 108 in a constant-current mode (CCM), switching rated current at rated voltage. For example, the high voltage node 106 can provide a voltage of 400V or 600V or greater, and the III-N transistors can be configured with a rating to withstand the resulting high currents. Due to the inductance of the load 114, current flowing through the load 114 cannot change instantaneously.

To illustrate the operation of the half bridge, consider an example scenario where the gate driver 102 turns the high side transistor 104 on and turns the low side transistor 108 off. Current flows from the high voltage node 106, through the high side transistor 104, and through the load node 112 to the load 114. When the gate driver 102 turns the high side transistor 104 off, the inductance of the load 114 drives the voltage at the load node 112 negative, which allows current to flow up through the low side transistor 108 even though it is off. If the half bridge is implemented using a conventional package, the undesirable inductance introduced by the package leads can cause significant ringing and oscillation related to transient current flowing through the circuit, which can interfere with a stable, efficient switching function. In order avoid sustained oscillation, it is important to guarantee that the gate stays turned off when the complementary device is turning on and any potential oscillation is removed from the circuit.

One method to minimize the oscillation is to optimize the PCB layout to minimize the gate-drain capacitance ($C_{GD}$), which strongly affects parasitic turn-on due to the voltage slew rate dv/dt. Alternative solutions are described below.

SUMMARY

In a first aspect, a circuit comprises an electronic component package is described. The electronic component package includes a first lead, a second lead, a third lead and a III-N transistor. The III-N transistor includes a drain, a gate, and a source, the source is coupled to the first lead, the gate is coupled to the second lead, and the drain is coupled to the third lead. The circuit further includes a high voltage node, and a resistor having a first terminal and a second terminal, where the first terminal of the resistor is coupled to the high voltage node, and the second terminal of the resistor is coupled to the third lead. The circuit further includes a ferrite bead connected in parallel to the resistor and coupled between the third lead and the high voltage node.

In a second aspect, a circuit is described. The circuit includes a driver with first and second high side output terminal and first and second low side output terminals. The circuit further includes a high side III-N transistor. The III-N transistor includes a high side gate coupled to the first high side output terminal of the gate driver, a high side drain coupled to a high voltage node and a high side source coupled to a load node. The circuit further includes a low side III-N transistor. The low side III-N transistor includes a low side gate coupled to the first low side output terminal of the gate driver, a low side drain coupled to the load node, and a low side source coupled to a ground node. The circuit further includes a ferrite bead coupled between the high side drain and the high voltage node.

In a third aspect, a circuit is described. The circuit includes a driver with first and second high side output terminal and first and second low side output terminals. The circuit further includes a high side III-N transistor. The III-N transistor includes a high side gate coupled to the first high side output terminal of the gate driver, a high side drain coupled to a high voltage node and a high side source coupled to a load node. The circuit further includes a low side III-N transistor. The low side III-N transistor includes a low side gate coupled to the first low side output terminal of the gate driver, a low side drain coupled to the load node, and a low side source coupled to a ground node. The circuit further includes a ferrite bead coupled between the high side source and the load node.

The circuits, transistors, half brides, switches, and components described herein may each include one or more of the following. A gate driver including a first terminal, a second terminal, a third terminal and a fourth terminal, the first terminal is coupled to the second lead and the second terminal is coupled to the first lead. The III-N transistor and the electronic component package can form a high side switch where the first lead is coupled to an output node, the circuit further including a low side switch coupled between the first lead and a ground node, the low side switch being coupled to the third terminal of the gate driver. A second ferrite bead coupled between a low side drain of the low side device and the output node. A gate driver configured to apply a low side control signal to the third terminal, and to apply a high side control signal to the first terminal. The voltage at the high voltage node relative to the ground node can be about 400V or higher. The gate driver can be configured to apply a control signal to the first terminal relative to the second terminal, where the control signal has a frequency between 30 kHz and 10 MHz. The III-N transistor can be an enhancement mode transistor. The III-N transistor can be a hybrid device including a depletion mode III-N transistor and an enhancement mode silicon transistor. The ferrite bead can form a passive low pass filter configured to block electromagnetic interference having frequencies above 50 MHz. The ferrite bead can have an effective resistance between 10Ω and 50Ω at 100 MHz and a DC resistance of less than 10 mΩ. The resistance of the resistor can be less than an effective resistance of the ferrite bead at 100 MHz and greater than the DC resistance of the ferrite bead. The resistance of the resistor can be between 1Ω and 10Ω.

The circuit can include a second ferrite bead coupled between the low side drain and the load node. The circuit can include a second ferrite bead coupled between the low side source and the ground node. The circuit can include a second resistor with a third terminal and a fourth terminal, where the first terminal of the second resistor is coupled to the high voltage node and the second terminal of the resistor is coupled to the low side drain. A high side III-N transistor encased in an electronic component package which includes a conductive structural base, where the high side III-N transistor is a lateral transistor, and the high side drain is electrically connected to the conductive structural base of the electronic package. A low side III-N transistor encased in an electronic component package which includes a conductive structural base, where the low side III-N transistor is a lateral III-N transistor, and the low side source is electrically connected to the conductive structural base of the electronic package. The first ferrite bead and the second ferrite bead can be SMD ferrite beads.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with 0≤w≤1, 0≤x≤1, 0≤y≤1, and 0≤z≤1. III-N materials, layers, or devices, can be formed or prepared by either directly growing on a suitable substrate (e.g., by metal organic chemical vapor deposition), or growing on a suitable substrate, detaching from the originally substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications.

As used herein, a "high-voltage device", e.g., a high-voltage switching transistor, is an electronic device which is optimized for high-voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, or other suitable blocking voltage required by the application.

As used herein, a "III-Nitride" or "III-N device" is a device based on III-N materials. The III-N device can be designed to operate as an enhancement-mode (E-mode) transistor device, such that the threshold voltage of the device (i.e., the minimum voltage that must be applied to the gate relative to the source in order to turn the device on) is positive. Alternatively, the III-N device can be a depletion-mode (D-mode) device, having a negative threshold voltage. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, or higher. When the high voltage device is biased on (e.g., the voltage on the gate relative to the source is greater than the device threshold voltage), it is able to conduct substantial current with a low on-voltage. The maximum allowable on-voltage is the maximum voltage that can be sustained in the application in which the device is used.

The details of one or more disclosed implementations of the subject matter described in this specification are set forth in the accompanying drawings and the description below. Other features, aspects, and advantages will become apparent from the description, the drawings and the claims.

DETAILED DESCRIPTION

Figure 1:
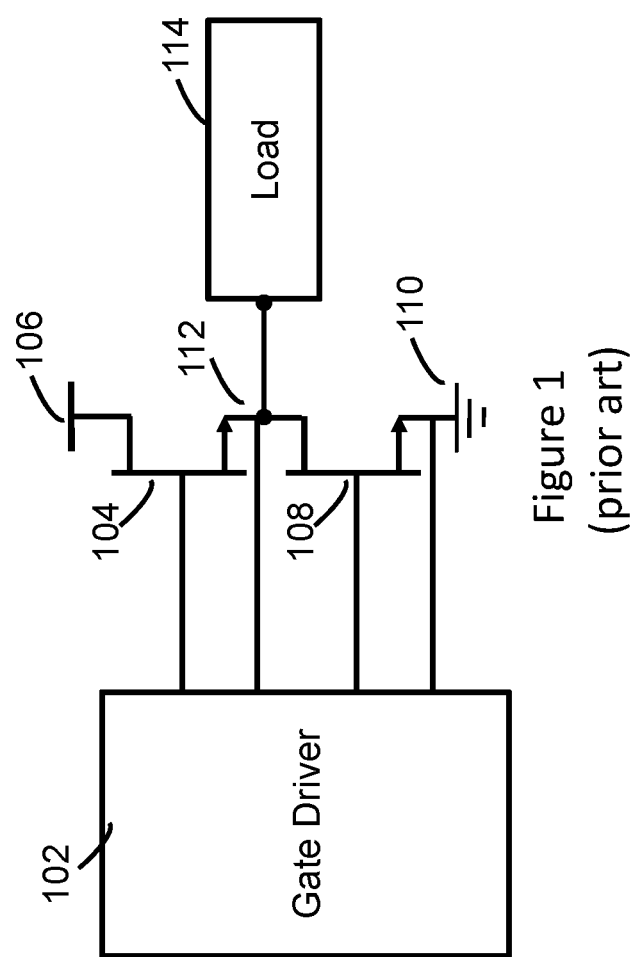
FIG. 1 is a circuit diagram of a half bridge circuit comprising a gate driver, a high side III-N transistor coupled to a high voltage node, and a low side III-N transistor coupled to a ground node.
Figure 2:
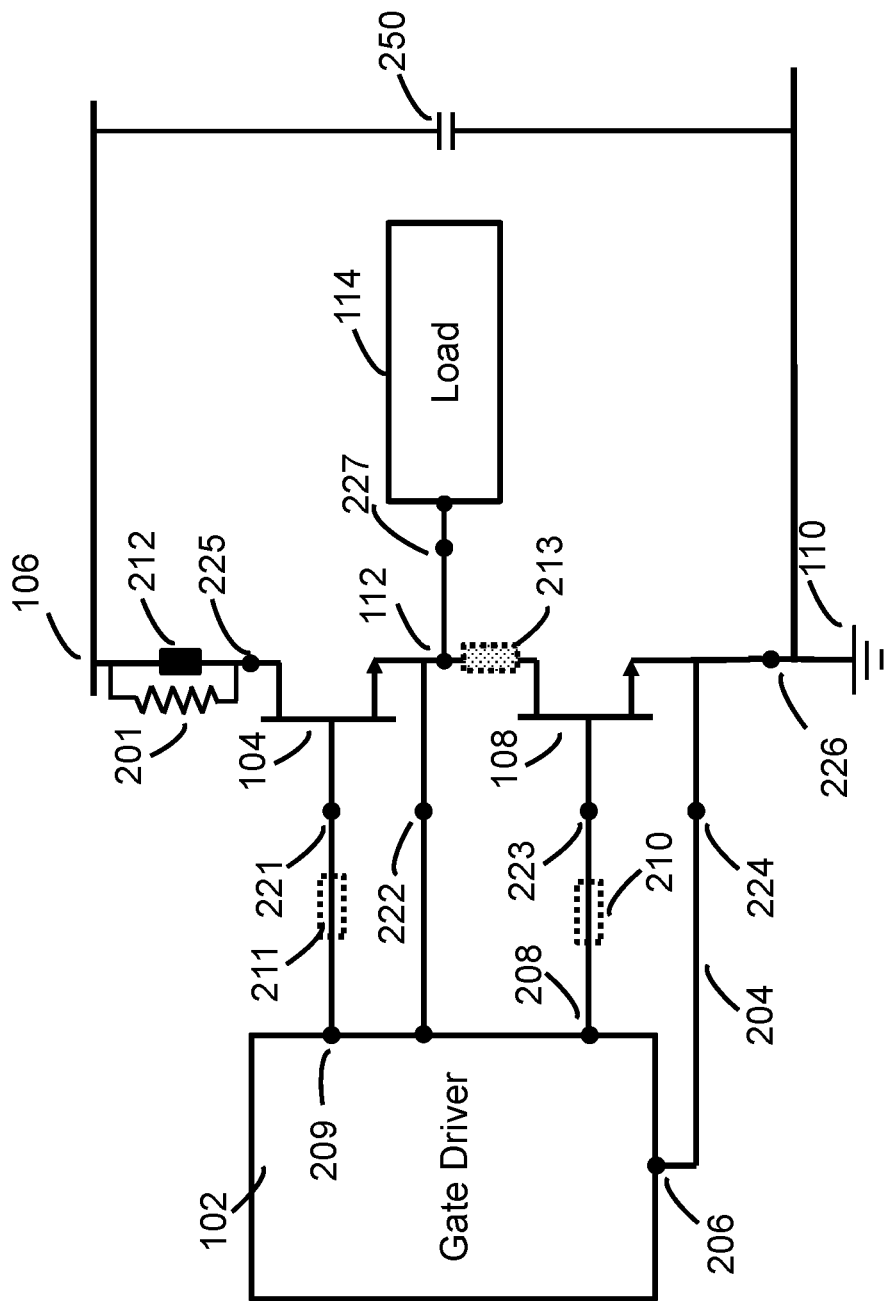
FIG. 2 is a circuit diagram of a half bridge circuit comprising a first ferrite bead coupled to the drain of the high side III-N transistor and a second ferrite bead coupled to the drain of the low side III-N transistor.

FIG. 2 is a circuit diagram of an example switching circuit. The circuit includes a high side switch 104 connected in series with a low side switch 108 in a half bridge configuration. The circuit includes nodes 221-227. Nodes 221 and 222 are coupled (e.g., electrically connected) to the gate and source, respectively, of switch 104. Nodes 223 and 224 are coupled (e.g., electrically connected) to the gate and source, respectively, of switch 108. Node 225 is coupled between the drain of switch 104 and the high voltage node 106. Node 226 is coupled (e.g., electrically connected) to the source of switch 108. Output node 227 is coupled (e.g., electrically connected) to load node 112 at the output of the half bridge formed by switches 104 and 108. The circuit further includes a gate driver 102 which is connected to nodes 221-224 of the circuit in order to apply voltage signals to the gates of switches 104 and 108 relative to their respective sources. A load 114 is coupled (e.g., electrically connected) to the circuit at output node 227. The electronic circuit can be formed as a circuit board with printed wiring connections that electrically couple the components of the circuit.

Switches 104 and 108 are capable of being operated at higher switching frequencies than some switches used in conventional high-voltage power switching circuits, such as switches implemented as silicon-based transistors (e.g., silicon-based MOSFETs or IGBTs). For example, switches 104 and 108 can be III-N transistors, such as the III-N transistor shown in FIG. 3, which may be capable of being switched at higher frequencies than silicon-based MOSFETs or IGBTs without exhibiting substantial additional power loss or other instabilities during operation.

Figure 3:
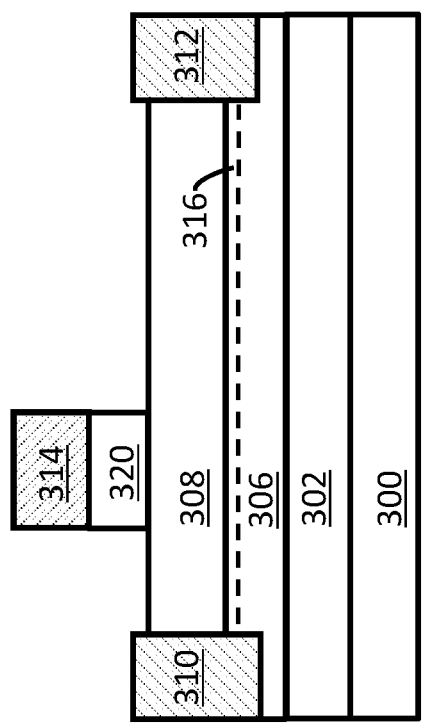
FIG. 3 is an illustration of a III-N transistor as an example of the switches in FIG. 2.

As seen in FIG. 3, a III-Nitride high electron mobility transistor (HEMT) can include a substrate 300 (e.g., a silicon substrate), a III-N buffer layer 302 formed of a III-N semiconductor material such as AlN or AlGaN, a III-N channel layer 306 formed of a III-N semiconductor material such as GaN, a III-N barrier layer 308 formed of a III-N semiconductor material (e.g., AlGaN or AlN) having a larger bandgap than that of the III-N channel layer 306, and a two-dimensional electron gas (2DEG) channel 316 formed in the III-N channel layer 306 adjacent to the III-N barrier layer 308. The 2DEG channel 316 serves as the conductive channel of the transistor. The III-N HEMT further includes source and drain contacts 310 and 312, respectively, which contact the 2DEG channel 316. A gate electrode 314, which is deposited between the source and drain contacts 310 and 312, is used to modulate the conductivity of the channel in the region directly below the gate electrode 314. Optionally, a gate insulator 320 is included between the gate electrode 314 and the underlying III-N semiconductor materials.

In many applications, it is preferable that switches 104 and 108 be enhancement-mode devices. However, switching devices formed of single high-voltage enhancement-mode transistors can be difficult to fabricate reliably. For example, due at least partially to tight process tolerances, it can be difficult to design a III-N HEMT such as the device shown in FIG. 3 such that it consistently and reliably operates as an enhancement-mode device with a positive threshold voltage. That is, even when a design is implemented for a III-N HEMT for which the resulting HEMT should be an enhancement-mode device, small variations in layer thicknesses, feature dimensions, etc., that typically occur can result in many of the devices either being depletion-mode devices or otherwise not exhibiting a high enough threshold voltage for reliable operation.

Figure 4:
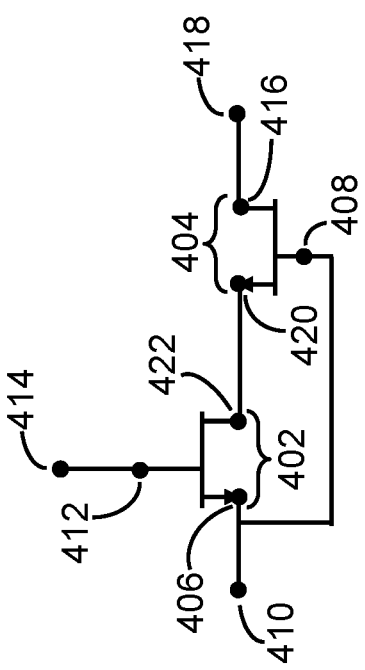
FIG. 4 is a circuit schematic illustrating a hybrid device as an example of the switches in FIG. 2, where the hybrid device includes a high-voltage D-mode transistor and a low-voltage E-mode transistor.

As an alternative to a single high-voltage enhancement-mode transistor, when enhancement-mode switches which can be operated at high switching frequencies are desired for switches 104 and 108, the switches can each be implemented as a hybrid device that includes a high-voltage depletion-mode (D-mode) transistor 404 and a low-voltage enhancement-mode (E-mode) transistor 402, configured as shown in FIG. 4. The resulting hybrid device of FIG. 4 can be operated in the same way as a single high-voltage E-mode transistor, and in many cases achieves the same or similar output characteristics as a single high-voltage E-mode transistor. The source electrode 406 of the low-voltage E-mode transistor 402 and the gate electrode 408 of the high-voltage D-mode transistor 404 are both electrically connected together, for example with wire bonds, and together form the source 410 of the hybrid device. The gate electrode 412 of the low-voltage E-mode transistor 402 forms the gate 414 of the hybrid device. The drain electrode 416 of the high-voltage D-mode transistor 404 forms the drain 418 of the hybrid device. The source electrode 420 of the high-voltage D-mode transistor 404 is electrically connected to the drain electrode 422 of the low-voltage E-mode transistor 402.

In particular implementations of the hybrid device of FIG. 4, the hybrid device is implemented as a III-N device. In this case, the D-mode transistor 404 is a high-voltage III-N D-mode transistor (e.g., capable of blocking at least 200V while biased in the OFF state), and the E-mode transistor 402 is a low-voltage silicon-based E-mode transistor (e.g., cannot reliably block voltages greater than 100V while biased in the OFF state). Although such an implementation of a III-N switch utilizes a silicon-based transistor in the switch, because the silicon-based transistor is a low-voltage device, the switch can still be capable of being operated at the higher switching frequencies.

Referring back to FIG. 2, due to the use of III-N transistors (as in FIG. 3) or hybrid devices (as in FIG. 4), e.g., III-N hybrid devices, as switches 104 and 108, the switching circuit illustrated in FIG. 2 can be operated at higher switching frequencies than some conventional switching circuits implemented using silicon transistors. For example, the switching circuits can be operated at a switching frequency of 30 kHz or higher, 50 kHz or higher, 80 kHz or higher, or up to 1 MHz or higher (i.e., during operation of the circuit, the switches can be switched at a frequency of 30 kHz or higher, 50 kHz or higher, 80 kHz or higher, or up to 1 MHz or higher).

When a switching circuit is designed to operate at a given switching frequency, unwanted noise and oscillations will occur at an even higher frequency. For example, if the switching frequency is about 1 MHz or less, the oscillations can be between about 50 MHz and 300 MHz. Unwanted oscillations are especially prone to occur in circuits operated at higher switching frequencies, even if the individual switches are capable of operation at the higher switching frequencies.

Referring again to FIG. 2, a ferrite bead 210 can optionally be coupled between the gate of the low side switch 108 and the second terminal 208 of the gate driver 102. A second ferrite bead 211 can also optionally be coupled between the gate of the high side switch 104 and the first terminal 209 of the gate driver 102. A ferrite bead is a passive electric component and typically includes a portion of an electrical current path and a hollow bead or cylinder made of ferrite, a semi-magnetic substance made from iron oxide alloyed with other metals surrounding the portion of the electrical current path. For example, a drain ferrite bead (e.g., like the ones described below) can be a through-hole ferrite bead slipped onto the drain lead. Alternatively, the drain ferrite bead can be a surface mounted device (SMD) where current flows through the ferrite bead. The ferrite beads 210, 211 can be used to suppress noise from electromagnetic interference (EMI) in a circuit. Further, the ferrite beads 210, 211 coupled between the gate driver-source and the gates of the high side and low side switches 104 and 108 can effectively control voltage slew rate dv/dt, which occurs when each switch 104, 108 is switched on or off, to reduce the ringing caused by the inductance of the gate driver-source feedback loop.

In the example switching circuit of FIG. 2, in which the half bridge formed by the high side and low side switches 104 and 108 and configured to be operated at the higher frequencies is implemented as part of an electronic circuit, the ferrite beads 210 and 211 in many cases will not be effective at suppressing all the noise in the circuit.

As further shown in FIG. 2, a drain ferrite bead 212 is a ferrite bead coupled between the high voltage node 106 and the drain of the switching device 104. This drain ferrite bead 212 increases the damping and lowers the Q-factor of the switching circuit shown in FIG. 2 due to the current slew rate di/dt in its power loop. The power loop of the switching circuit shown in FIG. 2 is made up of the drain and source of the switches 104 and 108 and the bypass capacitor (CBP) 250. The drain ferrite bead 212 acts as a series damping resistance at the resonant frequency of the power loop.

In addition, a drain ferrite bead 213, which is another ferrite bead, can optionally be coupled between the drain of the low side switch 108 and the output node 227. The drain ferrite bead 213 will add additional damping and reduce oscillations at the output node 227 that are contributed to the power loop from the low side switch 108. The gate ferrite beads 210 and 211 can be effective in reducing oscillations due to the high voltage slew rate dv/dt, while the drain ferrite beads 212 and 213 can be effective in reducing oscillations due to the high current slew rate di/dt. This is due to drain ferrite beads 212 and 213 being in the current path from the high voltage node 106, through the switches 104 and 108, to the ground node 110.

The drain ferrite beads 212 and 213 can have, for example, an impedance of between 10Ω and 50Ω at 100 MHz and a DC resistance of less than 10 mΩ or less than 5 mΩ when the oscillation frequency typically ranges from 50 MHz to 300 MHz.

Referring to FIG. 2, a resistor 201 can be included in parallel to the portion of the electrical path that is coupled to the drain ferrite bead 212. The resistor 201 has a first terminal and a second terminal, the first terminal being coupled to the high voltage node 106 and the second terminal being coupled to the drain of the high side switch 104. In addition, an additional resistor (not shown) can be connected in a similar manner across (i.e., in parallel to) the drain ferrite bead 213 of the low side switch 108. The resistor 201 can have a resistance that is less than the effective resistance of the drain ferrite bead 212 at 100 MHz and greater than the resistance of the drain ferrite bead at DC. For example, the resistor can have a resistance of less than 10Ω but greater than 1Ω. While the drain ferrite beads 212 and 213 act to reduce the oscillation at the output node 227, an initial voltage spike may still be present when the switches are operated. The resistor 201 can effectively reduce the magnitude of the voltage spike. The magnitude of the voltage spike with the resistor 201 can be less than ½ the magnitude of the voltage spike without the resistor 201.

Figure 5:
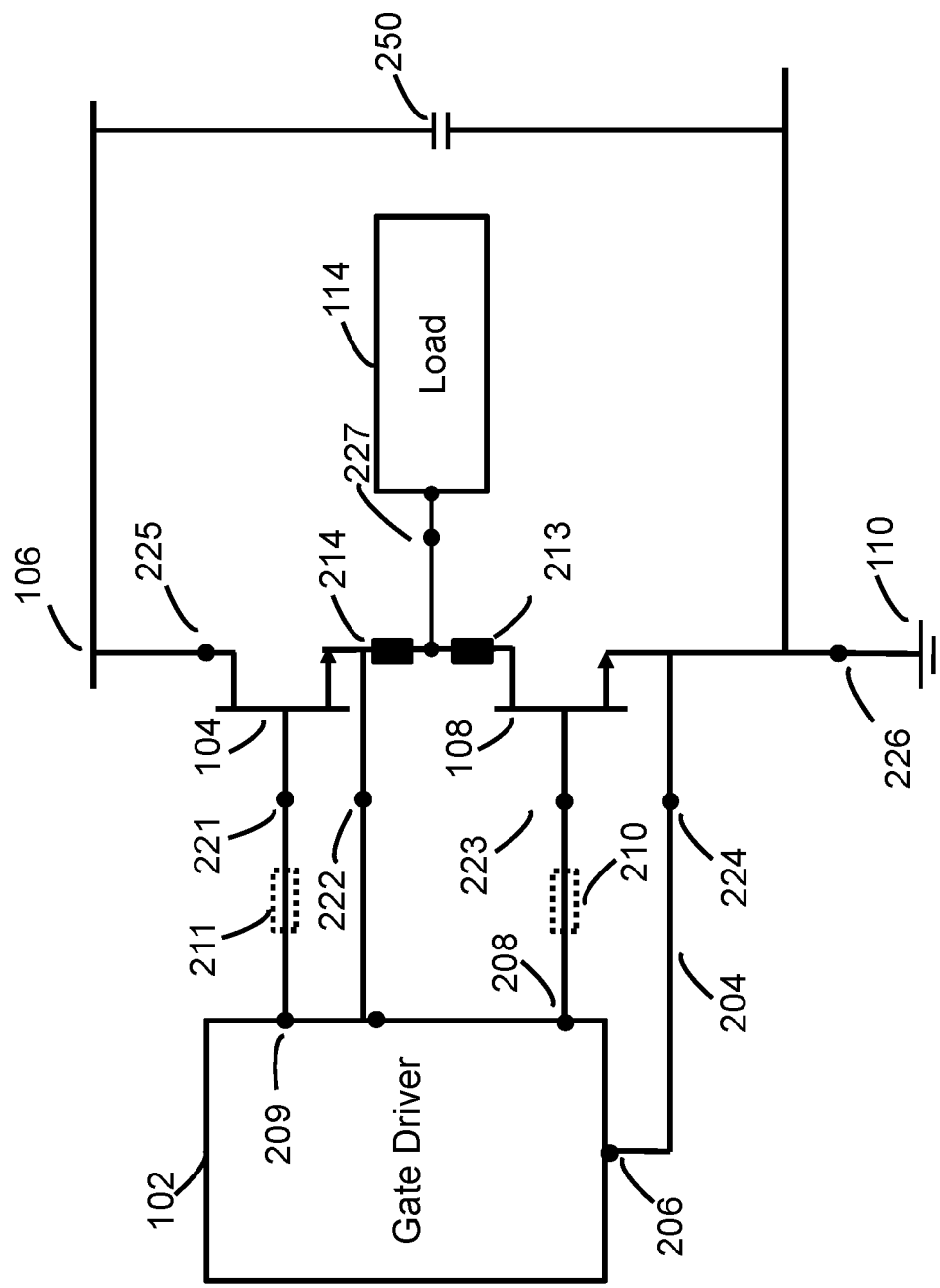
FIG. 5 is a circuit diagram of a half bridge circuit comprising a first ferrite bead coupled to the source of the high side III-N transistor and a second ferrite bead coupled to the drain of the low side III-N transistor.

FIG. 5 is a circuit diagram of another example switching circuit. This switching circuit can be constructed in a manner similar to the switching circuit of FIG. 2, except that in the configuration of FIG. 5, the drain ferrite bead 212 is not included in the circuit. Instead, a first ferrite bead 214 is coupled between the source of the high side switching device 104 and the output node 227, and a second ferrite bead 213 is coupled between the drain of the low side switching device 108 and the output node 227. Here, the combination of the first ferrite bead 214 and the drain ferrite bead 213 can be effective in reducing ringing and oscillations in the power loop of the switching circuit shown in FIG. 5 in a manner similar to the one described above for the circuit configuration of FIG. 2. Particular applications may favor the design of FIG. 5 compared to FIG. 2, while both can be effective in reducing circuit oscillations.

Figure 6:
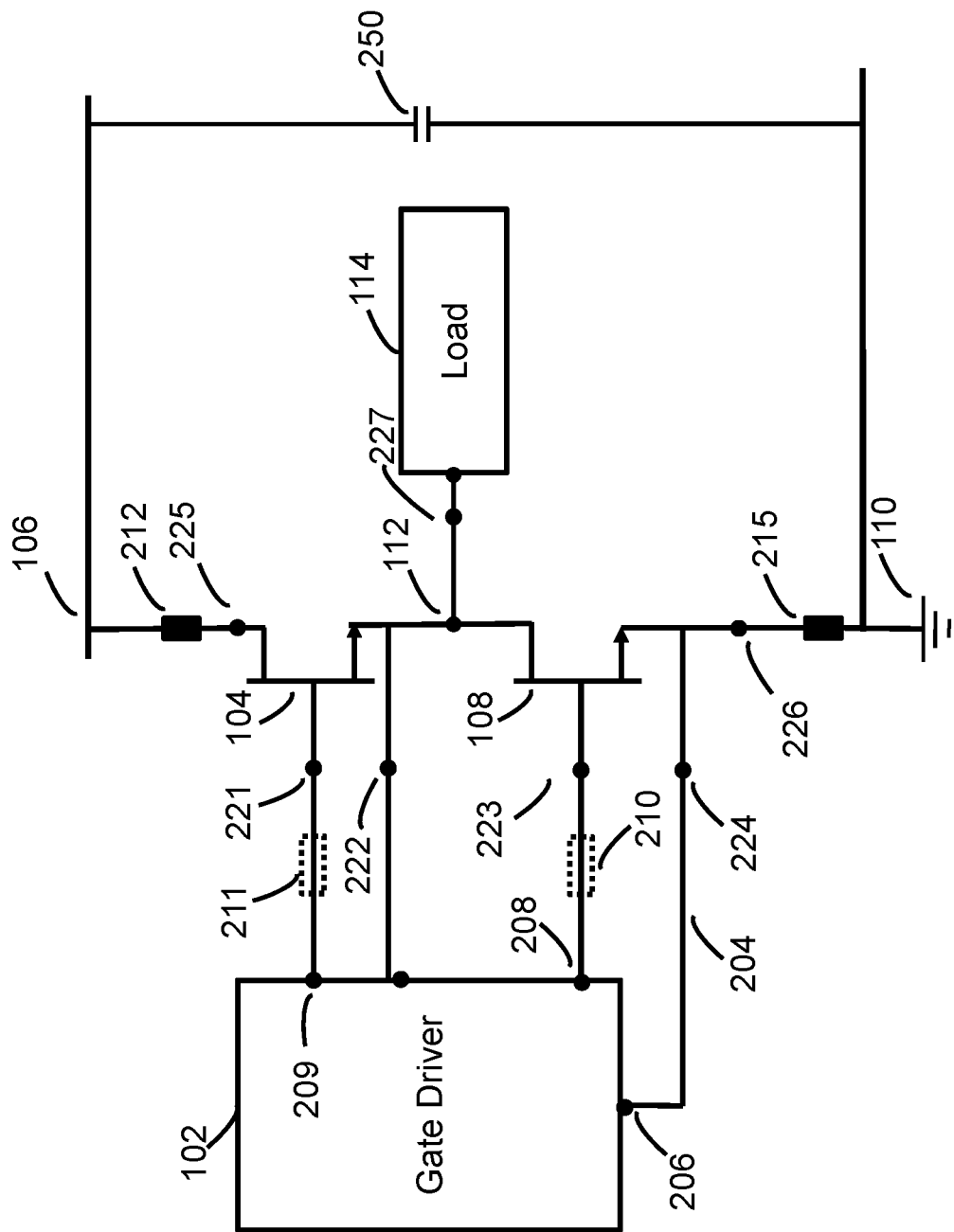
FIG. 6 is a circuit diagram of a half bridge circuit comprising a first ferrite bead coupled to the drain of the high side III-N transistor and a second ferrite bead coupled to the source of the low side III-N transistor.

FIG. 6 illustrates a switching circuit that can be constructed in a manner similar to the switching circuit of FIG. 2 with a drain ferrite bead 212 coupled between the drain of high side switch 104 and high voltage node 106 (as in FIG. 2), except that instead of ferrite bead 213, the circuit includes a second ferrite bead 215 coupled between the source of the low side switching device 108 and the ground node 110. This configuration requires the gate driver to be at a floating potential, where the gate driver (at node 206) is no longer directly connected to the ground node 110, which can increase the complexity of the circuit design.

The ferrite beads 212, 213, 214 and 215 in the circuits of FIGS. 2, 5, and 6 can be selected to form a passive low pass filter configured to block oscillations having frequencies above about 50 MHz or 300 MHz, and to pass switching frequencies, e.g., in the tens or hundreds of kHz or the 1 MHz range. Various ferrite beads are available, and an appropriate ferrite bead can be selected for a switching circuit based on a target switching frequency.

Figure 7:
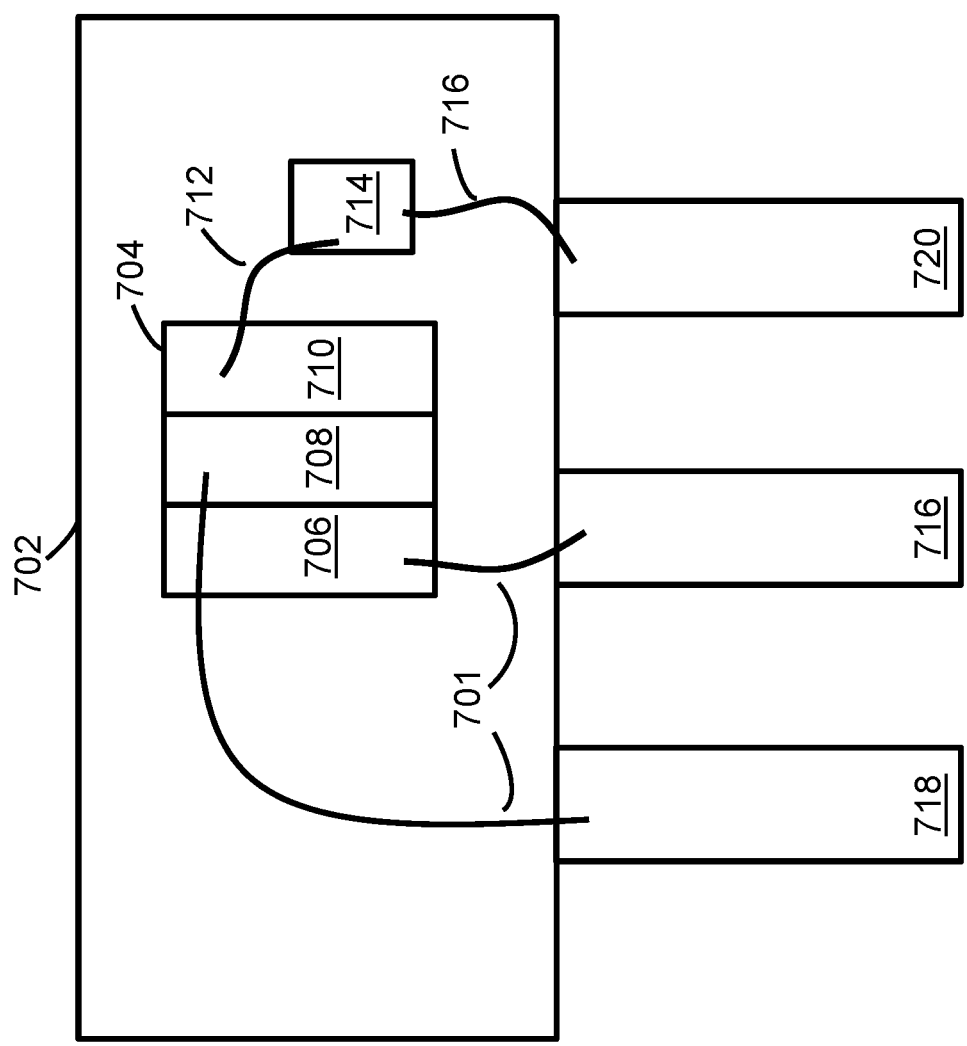
FIG. 7 is an illustration of a switch, which includes a III-N transistor and a ferrite bead encased in an electronic component package.

For the configurations of FIGS. 2, 5 and 6, individually packaged transistor switches can be used for switches 104 and 108. The ferrite beads 212, 213, 214 or 215 may alternatively be incorporated within the packages of their respective switches. FIG. 7 is an illustration of a switch which includes a III-N transistor 704 encased in an electronic package 702. The transistor 704 includes a source 706, a gate 708, and a drain 710. A first connector 712, which can for example be a wire bond, electrically couples the drain 710 to a ferrite bead 714 which is also encased in and mounted directly to the package 702. A second connector 716, which can for example also be a wire bond, electrically couples the ferrite bead 714 to a package lead 720 associated with the drain 710. By encasing the ferrite bead directly within the package 702, an external ferrite bead is not needed to use the switch in switching circuits which utilize individually packaged switches, e.g., the switching circuits illustrated in FIGS. 2, 5 and 6.

The packaged III-N device 704 illustrated in FIG. 7 can be a single chip enhancement mode power transistor, e.g., a single chip III-N E-mode transistor. Alternatively, the packaged III-N device 704 can be a hybrid device that includes an enhancement mode transistor and a depletion mode transistor, as was illustrated in FIG. 4.

Figure 8:
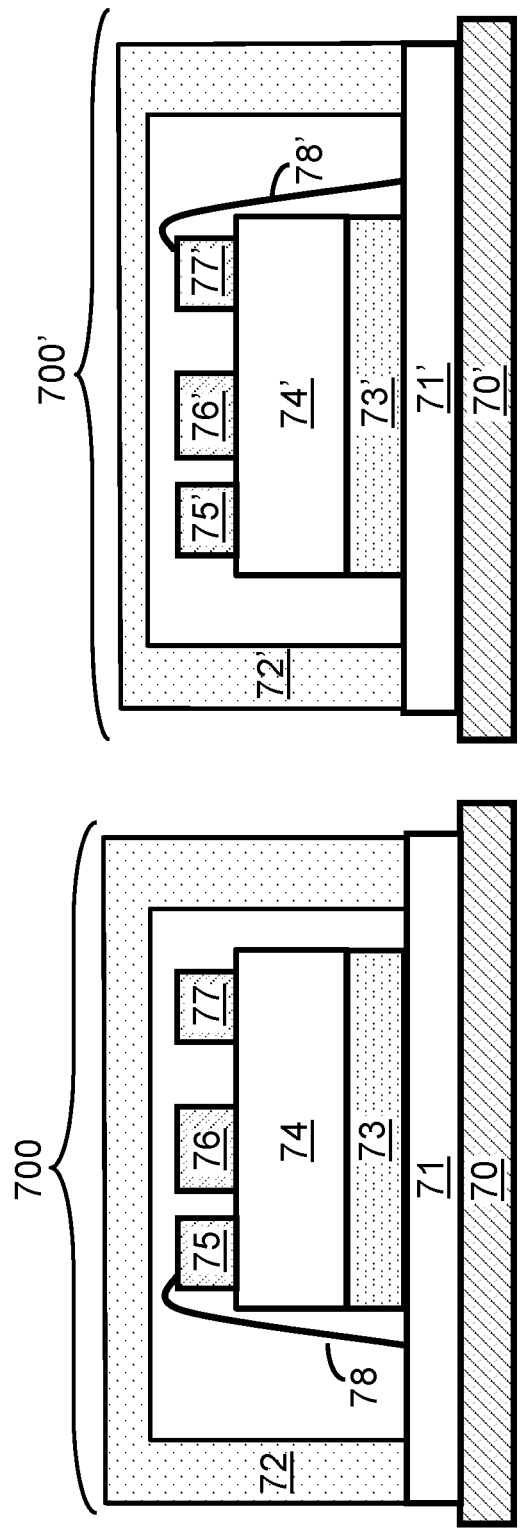
FIG. 8 is an illustration of switch, which includes a III-N transistor encased in an electronic package with two different configurations of the package base.

FIG. 8 is an illustration of an example transistor 700 and an example transistor 700' that are implemented using electronic packages and can be used for the individually packaged low side and high side switches 108 and 104, respectively, in FIGS. 2, 5 and 6. The transistors are lateral III-N devices. The package of transistor 700 includes a heat sink 70, a conductive package base 71, and a case 72 that can be formed of an insulating material. Inside the package, the active transistor includes a substrate 73, a semiconductor body 74, a source electrode 75, a gate electrode 76, and a drain electrode 77. The source electrode is wire bonded to the conductive package base 71 with wire 78, which is in turn coupled (e.g., electrically connected) to a source package lead. The gate 76 is coupled (e.g., electrically connected) to a gate package lead and the drain 77 is coupled (e.g., electrically connected) to a drain package lead.

The transistor 700' also includes a heat sink 70', a conductive package base 71', and a case 72'. The transistor 700' further includes a substrate 73', a semiconductor body 74', a source electrode 75', a gate electrode 76', and a drain electrode 77'. The drain electrode is wire bonded to the conductive package base 71' with wire 78', which is in turn coupled (e.g., electrically connected) to a drain package lead. The gate 76' is coupled (e.g., electrically connected) to a gate package lead and the source 75' is coupled (e.g., electrically connected) to a source package lead.

The transistors 700 and 700' can be used in a switching circuit, e.g., any of the switching circuits of FIGS. 2, 5 and 6. For example, transistors 700 (with the source connected to the package base) can be used both for the high side switch 104 and the low side switch 108 of the circuit of FIG. 2, since the switching devices of FIG. 2 both have drain connected ferrite beads. However, a relatively large capacitance exists between the package base and the heat sink. This capacitance can reduce the effectiveness of the ferrite bead. For this reason, it may be advantageous to have the package base coupled to the opposite side of the transistor relative to the ferrite bead. For example, referring to FIG. 5, transistor 700 can be used as the low side switch 108, and transistor 700' (with the drain connected to the package base) can be used as the high side switch 104. In another example, referring to FIG. 6, transistor 700 can be used as the high side switch 104, and transistor 700' can be used as the low side switch 108. Using the transistors 700 and 700' in this configuration can improve capacitive coupling in a switching circuit.

Figure 9:
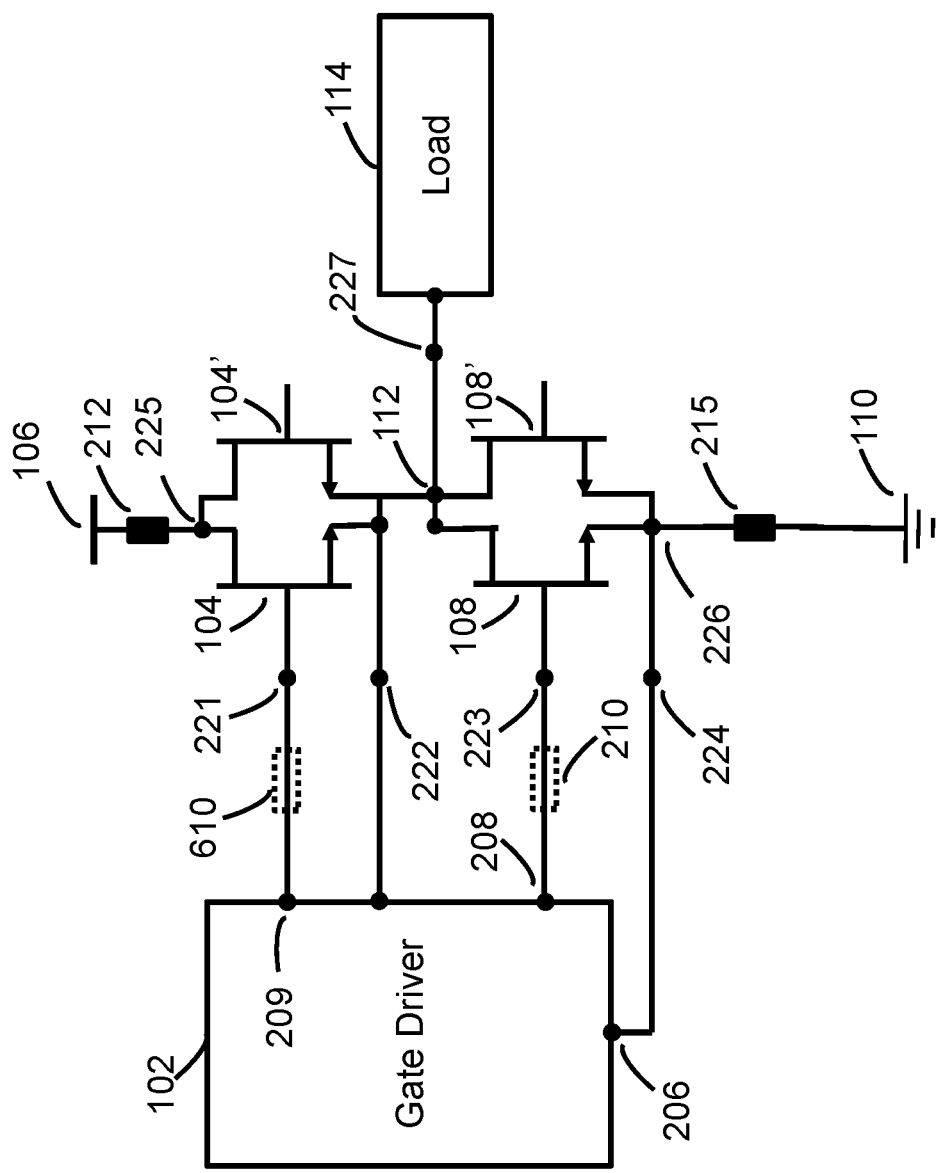
FIG. 9 is a circuit diagram of a half bridge circuit, similar to the half bridge circuit in FIG. 6, comprising two high side and two low side III-N transistors connected in parallel.

FIG. 9 is a circuit diagram of a switching circuit. The electronic circuit in FIG. 9 differs from the electronic circuit of FIG. 6 in that the high side switch is implemented as a pair of switches 104 and 104' connected in parallel, and the low side switch is implemented as a pair of switches 108 and 108' connected in parallel. Many applications require larger load currents than can be supported by individual switches. Connecting two switches in parallel, as in FIG. 9, allows the maximum current that can be delivered to the load to be approximately double the current that can be delivered when a single switch is used for each of the high and low side switches, as in FIG. 6. Although not shown in FIG. 9, the high and low side switches can each include N switches connected in parallel, where N is an integer greater than 2. In this case, the maximum current that can be delivered to the load will be approximately N times the current that can be delivered when a single switch is used for each of the high and low side switches. FIG. 9 shows the ferrite beads 212 and 215 connected in a similar configuration as the ferrite beads shown in FIG. 6, however the ferrite beads can also be alternatively connected in a similar configuration as those shown in FIG. 2 or FIG. 5.

Although not shown in FIG. 9 for the sake of clarity, the gate of switch 104' is coupled to terminal 209 of the gate driver 102, and the gate of switch 108' is coupled to terminal 208 of the gate driver 102. Now, referring to the drain ferrite bead 212, the drain of switch 104' can be connected to node 225 such that drain ferrite bead 212 is shared by switches 104 and 104'. Also, the source of switch 108' can be connected to the node 226 such that the second ferrite bead 215 is shared by switches 108 and 108'. Alternatively, the switches 104' and 108' can each be connected to their own additional ferrite beads (not shown for the sake of clarity), with the opposite ends of the additional ferrite beads connected to node 225 and 226, respectively.

When half bridge switches are formed with parallel devices, as in FIG. 9, but without ferrite beads coupled to the switches, the half bridge switches tend to be unstable during operation. Inclusion of the ferrite beads has been found to substantially increase the stability of these circuits. While providing each of the parallel devices with its own ferrite bead on its leads tends to result in more stable operation than when a single ferrite bead is shared by all the parallel devices, it is typically simpler to design and implement a switching circuit like the one in FIG. 9 in which a single ferrite bead is shared by all the parallel devices.

Figure 10:
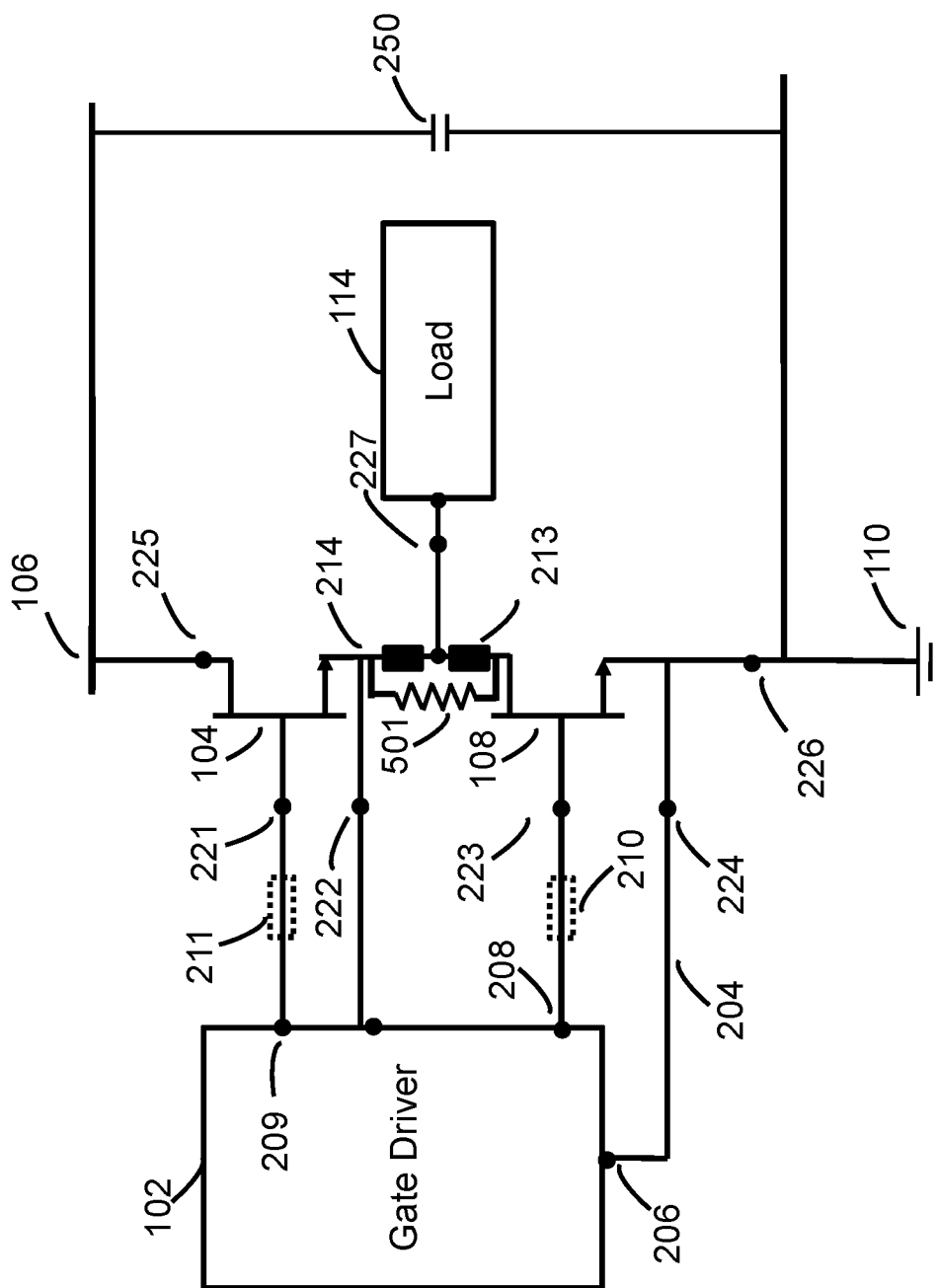
FIG. 10 is a circuit diagram of a half bridge circuit, similar to the half bridge circuit in FIG. 5, with an additional resistor connected between the source of the high side III-N transistor and the drain of the low side III-N transistor.

FIG. 10 is a switching circuit diagram of a circuit similar to the one shown in FIG. 5. Here, a single resistor 501 is connected across both ferrite beads 214 and 213. The resistor 501 has a first terminal and a second terminal, where the first terminal is coupled to the source of the high side switch 104 and the second terminal is coupled to the drain of the low side switch 108. Resistor 501 can reduce the overshoot voltage spike during circuit switching in a similar manner as resistor 201 of FIG. 2. The resistor 501 can have similar values as resistor 201. Here, using a single resistor across both ferrite beads can reduce the number of parts required and simplify the circuit layout design.

Figure 11:
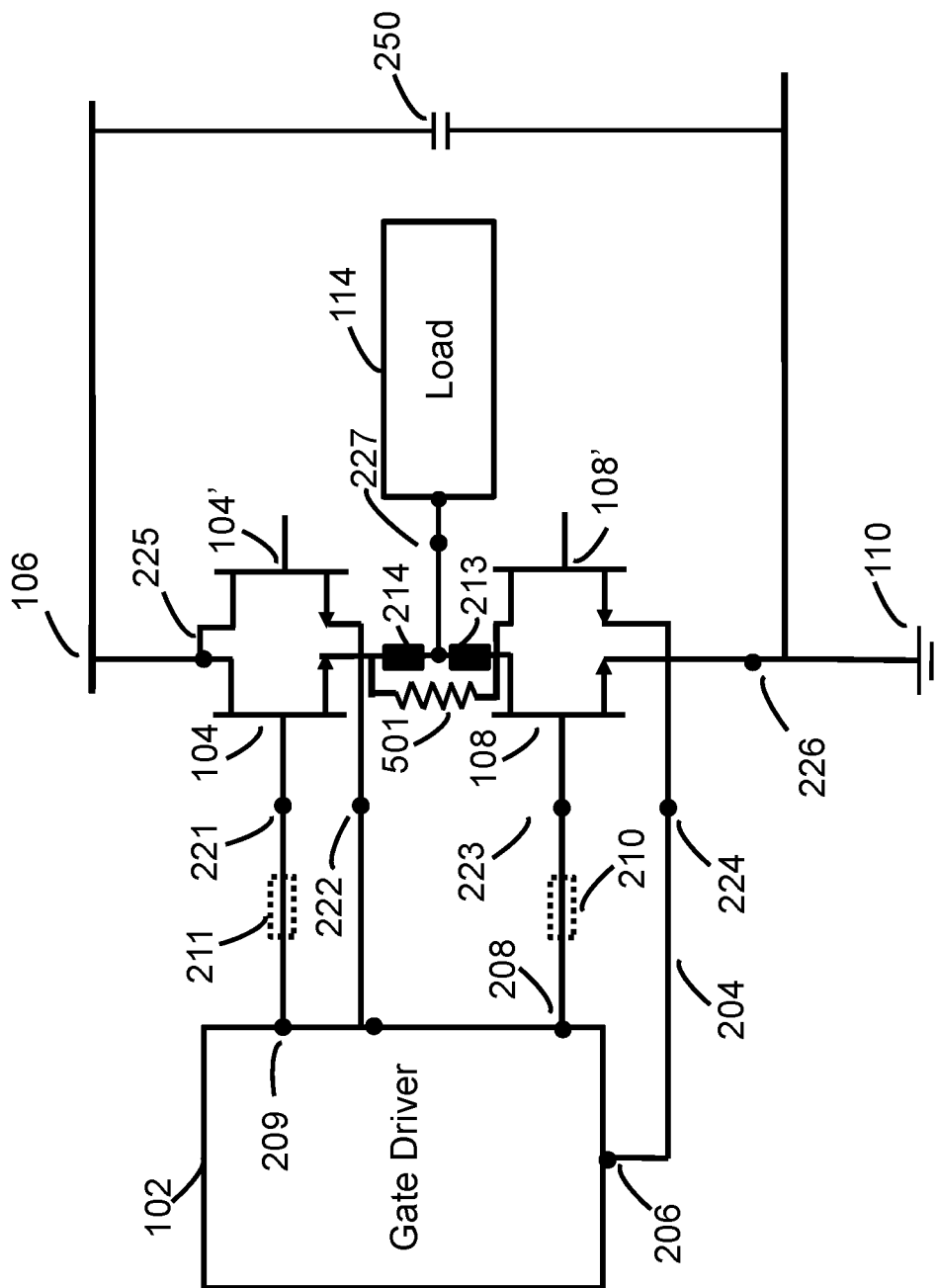
FIG. 11 is a circuit diagram of a half bridge circuit, similar to the half bridge circuit in FIG. 10, comprising two high side and two low side III-N transistors connected in parallel.

FIG. 11 is a circuit diagram of a switching circuit. The electronic circuit in FIG. 11 differs from the electronic circuit of FIG. 10 in that the high side switch is implemented as a pair of switches 104 and 104' connected in parallel, and the low side switch is implemented as a pair of switches 108 and 108' connected in parallel. The circuit configurations of FIG. 11 can be similar to those described in regards to the parallel switches of FIG. 9. Although not shown in FIG. 11, the high and low side switches can each include N switches connected in parallel, where N is an integer greater than 2. In this case, the maximum current that can be delivered to the load will be approximately N times the current that can be delivered when a single switch is used for each of the high and low side switches.

Now, referring to the source ferrite bead 214, the source of switch 104' can be connected such that source ferrite bead 214 is shared by switches 104 and 104'. Also, the drain of switch 108' can be connected such that the second ferrite bead 213 is shared by switches 108 and 108'. Alternatively, the switches 104' and 108' can each be connected to their own additional ferrite beads (not shown for the sake of clarity), with the opposite ends of the additional ferrite beads connected to the load node 227. Here, a single resistor 501 can be connected across both ferrite beads 214 and 213. The resistor 501 has a first terminal and a second terminal, where the first terminal is coupled to the source of the high side switches 104 and 104', and the second terminal is coupled to the drains of the low side switches 108 and 108'. Alternatively, a first terminal of the a second resistor can be coupled to the source of the high side switch 104' and a second terminal of the second resistor can be coupled to the drain of the low side switch 108' in an embodiment where the high side switches 104 and 104', and low side switches 108 and 108' each are connected to their own additional ferrite bead (not shown for the sake of clarity).

A number of implementations have been described. Nevertheless, it will be understood that various modifications may be made without departing from the spirit and scope of the techniques and devices described herein. For example, in the circuits in which the half bridge is provided as an electronic module, the ferrite beads may be included within or as part of the module. Accordingly, other implementations are within the scope of the following claims.

What is claimed is:

1. A circuit comprising:
    an electronic component package comprising a first lead, a second lead, and a third lead;
    a III-N transistor encased in the electronic component package, the III-N transistor comprising a drain, a gate, and a source, the source coupled to the first lead, the gate coupled to the second lead, and the drain coupled to the third lead;
    a high voltage node; and
    a resistor having a first terminal and a second terminal, wherein the first terminal of the resistor is coupled to the high voltage node, and the second terminal of the resistor is coupled to the third lead; and
    a ferrite bead connected in parallel to the resistor and coupled between the third lead and the high voltage node.

2. The circuit of claim 1, further comprising a gate driver, the gate driver comprising a first terminal, a second terminal, a third terminal and a fourth terminal, the first terminal being coupled to the second lead and the second terminal being coupled to the first lead.

3. The circuit of claim 2, wherein the III-N transistor and the electronic component package form a high side switch, and the first lead is coupled to an output node, the circuit further comprising a low side switch coupled between the first lead and a ground node, the low side switch being coupled to the third terminal of the gate driver.

4. The circuit of claim 3, further comprising a second ferrite bead coupled between a low side drain of the low side switch and the output node.

5. The circuit of claim 3, wherein the gate driver is configured to apply a low side control signal to the third terminal, and to apply a high side control signal to the first terminal.

6. The circuit of claim 3, wherein the voltage at the high voltage node relative to the ground node is about 400V or higher.

7. The circuit of claim 6, wherein the gate driver is configured to apply a control signal to the first terminal relative to the second terminal, the control signal having a frequency between 30 kHz and 10 MHz.

8. The circuit of claim 1, wherein the III-N transistor is an enhancement mode transistor.

9. The circuit of claim 1, wherein the III-N transistor is a hybrid device comprising a depletion mode III-N transistor and an enhancement mode silicon transistor.

10. The circuit of claim 1, wherein the ferrite bead forms a passive low pass filter configured to block electromagnetic interference having frequencies above 50 MHz.

11. The circuit of claim 1, wherein the ferrite bead has an effective resistance between 10Ω and 50Ω at 100 MHz and a DC resistance of less than 10 mΩ.

12. The circuit of claim 11, wherein a resistance of the resistor is between 1Ω and 10Ω.

13. The circuit of claim 1, wherein a resistance of the resistor is less than an effective resistance of the ferrite bead at 100 MHz, and the resistance of the resistor is greater than a DC resistance of the ferrite bead.

14. A circuit comprising:
    a gate driver comprising a high side output terminal, a low side output terminal, a high side input terminal, and a low side input terminal;
    a high side III-N transistor comprising:
        a high side gate coupled to the high side output terminal of the gate driver;
        a high side drain coupled to a high voltage node; and
        a high side source coupled to a load node;
    a low side III-N transistor comprising:
        a low side gate coupled to the low side output terminal of the gate driver;
        a low side drain coupled to the load node; and
        a low side source coupled to a ground node; and
    a ferrite bead coupled between the high side drain and the high voltage node and a second ferrite bead coupled between the low side drain and the load node; and
    a first resistor with a first terminal and a second terminal, wherein the first terminal of the first resistor is coupled to the high voltage node and the second terminal of the first resistor is coupled to the high side drain.

15. The circuit of claim 14, wherein the high side III-N transistor is implemented as two or more III-N transistors connected in parallel, and the low side III-N transistor is implemented as two or more III-N transistors connected in parallel.

16. The circuit of claim 14, further comprising a second resistor with a third terminal and a fourth terminal, wherein the third terminal of the second resistor is coupled to the load node and the fourth terminal is coupled to the low side drain.

17. The circuit of claim 16, wherein the ferrite bead has an effective resistance between 10Ω and 50Ω at 100 MHz and a DC resistance of less than 10 mΩ.

18. The circuit of claim 16, wherein a resistance of the first resistor and the second resistor is between 1Ω and 10Ω.

19. The circuit of claim 16, wherein a resistance of the first resistor is less than an effective resistance of the ferrite bead at 100 MHz, and the resistance of the first resistor is greater than a DC resistance of the ferrite bead.

20. The circuit of claim 14, wherein during operation of the circuit, the voltage at the high voltage node relative to the ground node is at least 400V.

21. The circuit of claim 14, wherein the gate driver is configured to apply control signals to the high side output terminal relative to the high side input terminal and to the low side output terminal relative to the low side input terminal, the control signals having a frequency between 30 kHz and 10 MHz.

22. The circuit of claim 14, wherein the high side III-N transistor comprises a III-N enhancement mode transistor.

23. The circuit of claim 14, wherein the high side III-N transistor is a hybrid device comprising a depletion mode III-N transistor and an enhancement mode silicon transistor.

24. The circuit of claim 14, wherein the ferrite bead forms a passive low pass filter configured to block electromagnetic interference having frequencies above 50 MHz.

* * * * *